United States Patent [19]
Fujii et al.

[11] Patent Number: 5,341,014
[45] Date of Patent: Aug. 23, 1994

[54] SEMICONDUCTOR DEVICE AND A METHOD OF FABRICATING THE SAME

[75] Inventors: Toyokazu Fujii, Moriguchi; Yasushi Naito, Toyonaka, both of Japan

[73] Assignee: Matsushita Electric Industrial Co., Ltd., Osaka, Japan

[21] Appl. No.: 989,347

[22] Filed: Dec. 11, 1992

[30] Foreign Application Priority Data

Jan. 7, 1992 [JP] Japan .................. 4-000625
Aug. 26, 1992 [JP] Japan .................. 4-226862

[51] Int. Cl.$^5$ ............... H01L 23/48; H01L 21/44
[52] U.S. Cl. .................. 257/377; 257/383; 257/384; 257/385; 257/413; 437/177; 437/189; 437/192; 437/200
[58] Field of Search ............ 257/377, 383, 384, 385, 257/413; 437/177, 189, 192, 200

[56] References Cited

U.S. PATENT DOCUMENTS

| | | | |
|---|---|---|---|
| 4,488,166 | 12/1984 | Lehrer | 257/755 |
| 4,640,844 | 2/1987 | Neppl et al. | |
| 4,985,746 | 1/1991 | Asahina | |

FOREIGN PATENT DOCUMENTS

| | | |
|---|---|---|
| 57-192079 | 11/1982 | Japan . |
| 59-195870 | 11/1984 | Japan . |
| 60-140870 | 7/1985 | Japan . |
| 61-139067 | 6/1986 | Japan . |
| 62-86865 | 4/1987 | Japan . |
| 1-186655 | 7/1989 | Japan . |
| 2-192161 | 7/1990 | Japan . |
| 3-283565 | 12/1991 | Japan . |

OTHER PUBLICATIONS

L. C. Parrillo et al., "A Fine-Line CMOS Technology That Uses P+-Polysilicon/Silicide Gates For NMOS and PMOS Devices", *IEEE, IEDM 84, 15.6,* at pp. 418–422, 1984.

S. P. Murarka et al., "Dopant Redistribution in Silicide–Silicon and Silicide–Polycrystalline Silicon Bilayered Structures", *J. Vac. Sci. Technol.* B 5(6), at pp. 1674–1688, Nov./Dec. 1987.

F. C. Shone et al., "Formation of 0.1 μm N+/P and P+/N Junction by Doped Silicide Technology", *IEEE, IEDM* 85, 15.3, at pp. 407–410, 1986.

F. C. Shone et al., "Modeling Dopant Redistribution in SiO$_2$/WSi$_2$/Si Structure", *IEEE, IEDM* 86, 20.5, at pp. 534–537, 1986.

C. L. Chu et al., "Technology Limitations for N+/P+ Polycide Gate CMOS Due to Lateral Dopant Diffusion in Silicide/Polysilicon Layers", *IEEE Electron Device Letters*, vol. 12, No. 12, at pp. 696–698, Dec. 1991.

H. Hayashida et al., "Dopant Redistribution in Dual Gate W-Polycide CMOS and Its Improvement by RTA", *1989 Symposium on VLSI Technology, Digest of Technical Papers*, Section 4-2 at pp. 29–30, May 22–25, 1989.

*Primary Examiner*—Edward Wojkciechowicz
*Attorney, Agent, or Firm*—Ratner & Prestia

[57] ABSTRACT

A semiconductor device of the present invention includes a semiconductor substrate, a p-type impurity diffused region formed in the semiconductor substrate, and a polycide interconnection electrically connected to the p-type impurity diffused region. In the semiconductor device, the polycide interconnection includes a first polysilicon film, a refractory metal silicide film formed on the first polysilicon film, and a second polysilicon film formed on the refractory metal silicide film.

8 Claims, 11 Drawing Sheets

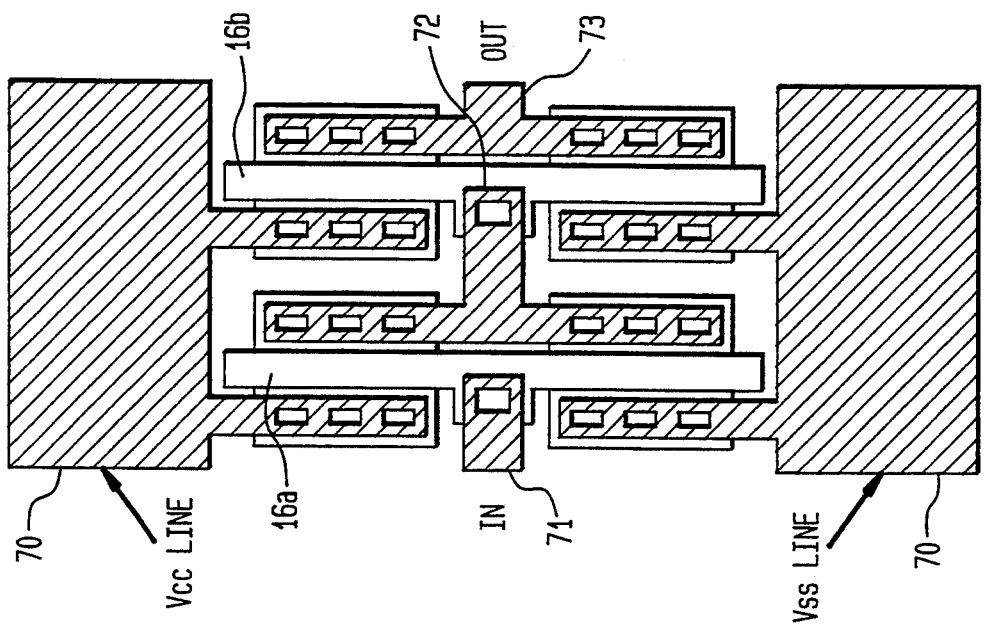
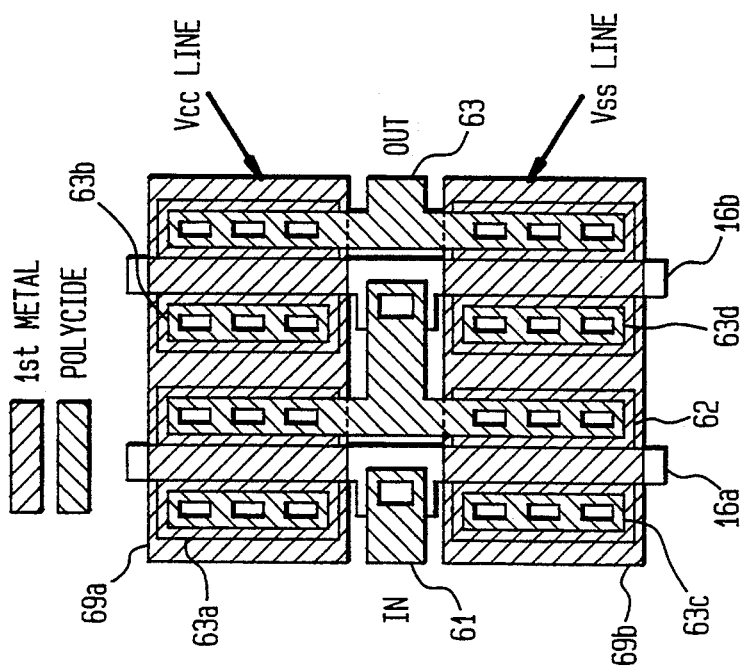

SEMICONDUCTOR DEVICE AND A METHOD OF FABRICATING THE SAME

BACKGROUND OF THE INVENTION

1. Field of the Invention

The present invention relates to a semiconductor device and a method of fabricating the same. More particularly, the present invention relates to a semiconductor device which avoids a degradation in contact resistance due to annealing steps in the fabrication process and a method of fabricating the same.

2. Description of the Related Art

In a p-channel MOS transistor having a $p^+$-type polycrystalline silicon (hereinafter called polysilicon) gate electrode, the short channel effect can be further reduced and a lower threshold voltage ($V_{th}$) of the MOS transistor can be set, as compared with a p-channel MOS transistor having an $n^+$-type polysilicon gate electrode. This is disclosed, for example, in IEEE, IEDM, Technical Digest, pp. 418–422 (1984).

In order to electrically connect a $p^+$-type impurity diffused region which is formed in a semiconductor substrate with a polysilicon interconnection, a $p^+$-type polysilicon film is used as the polysilicon interconnection. The $p^+$-type polysilicon film has a higher specific resistance than those of typical metals. Since an interconnection and an electrode are preferably formed from a material having a low specific resistance, the interconnection and the electrode are sometimes formed of a $p^+$-type polycide film in which a refractory metal silicide film or the like is laminated on the $p^+$-type polysilicon film.

The $p^+$-type polycide film is made from refractory materials which will not deteriorate even by an annealing process at a temperature of 900° C. or higher. Therefore, it is possible to form a borophospho silicate glass (BPSG) film as an interlevel insulating film after the formation of the interconnection and the electrode from the $p^+$-type polycide film, and to anneal the BPSG film for planarization. A semiconductor device which is fabricated in such a manner is shown in Japanese Laid-Open Patent Publication No. 57-192079.

Even when the BPSG film is not used as the interlevel insulating film, it is necessary to perform annealing after the formation of the $p^+$-type polycide film, in order to activate the $p^+$-type impurities. During the annealing, the boron concentration may decrease due to an outdiffusion of boron. In order to prevent the decrease in boron concentration, it is required to deposit an insulating film on the $p^+$-type polycide film prior to the annealing. This is disclosed, for example, in J. Vac. Sci. Technol. B, vol. 5, pp. 1674–1688, 1987.

However, the above prior art has the following problem.

There is a known phenomenon that, when the $p^+$-type polycide film is annealed, boron will segregate to the interface between the $p^+$-type polycide film and the insulating film covering the $p^+$-type polycide film, whereby the boron concentration in the $p^+$-type polycide film decreases. This phenomenon is described, for example, in IEEE, IEDM, Technical Digest, pp. 407–410 (1985).

The decrease in boron concentration will cause the following problems: (1) when the $p^+$-type polycide film is used as a gate electrode of an MOS transistor, the threshold voltage of the MOS transistor will vary with the decrease in boron concentration; and (2) when the $p^+$-type polycide film is used as an interconnection which is in contact with a p-type impurity diffused region, a contact resistance will increase with the decrease in boron concentration.

SUMMARY OF THE INVENTION

The semiconductor device of this invention includes: a semiconductor substrate; a p-type impurity diffused region formed in the semiconductor substrate; and a polycide interconnection electrically connected to the p-type impurity diffused region, wherein the polycide interconnection comprises a first polysilicon film, a refractory metal silicide film formed on the first polysilicon film, and a second polysilicon film formed on the refractory metal silicide film.

In another embodiment, the semiconductor device further includes a p-channel MOS transistor formed on the semiconductor substrate, wherein the p-type impurity diffused region is either one of a source and a drain of the p-channel MOS transistor.

In another embodiment, the first polysilicon film in the polycide interconnection has both a portion in which p-type impurities are diffused and a portion in which n-type impurities are diffused.

In another embodiment, in the second polysilicon film in the polycide interconnection, p-type impurities are substantially uniformly diffused in a lateral direction.

According to another aspect of the present invention, a polycide interconnection is provided. The polycide interconnection includes a first polysilicon film, a refractory metal silicide film formed on the first polysilicon film, and a second polysilicon film formed on the refractory metal silicide film, wherein the first polysilicon film has both a portion in which p-type impurities are diffused and a portion in which n-type impurities are diffused, and the p-type impurities are substantially uniformly diffused in a lateral direction in the second polysilicon film.

According to another aspect of the present invention, a CMOS semiconductor device is provided. The CMOS semiconductor device includes: a semiconductor substrate; and n-channel MOS transistors and p-channel MOS transistors formed at the semiconductor substrate, wherein the n-channel MOS transistor has an n-type source and an n-type drain formed from an n-type impurity diffused region in the semiconductor substrate, the p-channel MOS transistor has a p-type source and a p-type drain formed from a p-type impurity diffused region in the semiconductor substrate, the semiconductor device further comprises a first polysilicon film, a refractory metal silicide film formed on the first polysilicon film, and a second polysilicon film formed on the refractory metal silicide film, and the first polysilicon film has an n-type impurity diffused portion which is connected to the n-type source or the n-type drain, and a p-type impurity diffused portion which is connected to the p-type source or the p-type drain.

In another embodiment, in the second polysilicon film, p-type impurities are substantially uniformly diffused in a lateral direction.

According to yet another aspect of the present invention, a semiconductor device is provided. The semiconductor device includes: a semiconductor substrate; a source and a drain formed in the semiconductor substrate; a gate insulating film formed on the semiconductor substrate; and a gate electrode formed on the gate insulating film, wherein the gate electrode has a first polysilicon film, a refractory metal silicide film formed on the first polysilicon film, and a second polysilicon film formed on the refractory metal silicide film, and p-type impurities are substantially uniformly diffused in a lateral direction in the second polysilicon film.

In another embodiment, the p-type impurities are substantially uniformly diffused in a lateral direction in the refractory metal silicide film.

According to yet another aspect of the present invention, a method of fabricating a semiconductor device is provided. The method includes the steps of forming a p-type impurity diffused region in a semiconductor substrate and forming a polycide interconnection which is connected to the p-type impurity diffused region. The step of forming the polycide interconnection includes the steps of: forming a first polysilicon film which is connected to the p-type impurity diffused region; forming a refractory metal silicide film on the first polysilicon film; and forming a second polysilicon film on the refractory metal silicide film.

In another embodiment, the method further includes a step of doping p-type impurities into the second polysilicon film.

In another embodiment, the step of doping the p-type impurities into the second polysilicon film is the step of implanting the p-type impurities over the entire top surface of the second polysilicon film using ion implantation.

According to the semiconductor device of this invention, the boron segregation in the polycide interconnection is prevented, so that a boron concentration in the polycide interconnection will not decrease due to annealing. As a result, a threshold voltage of an MOS transistor having such a polycide interconnection as a gate electrode is difficult to vary. Moreover, stable contact characteristics can be obtained so that a contact resistance between the polycide interconnection and the p-type impurity diffused region will not increase due to the annealing.

According to the invention, a lateral diffusion of impurities can be prevented from occurring in a dual-polycide interconnection, whereby an improved CMOS semiconductor device can be provided in which a degradation in contact characteristics is avoided.

Thus, the invention described herein makes possible the advantage of providing a semiconductor device having a polycide interconnection in which the boron concentration cannot be reduced by annealing, and a method of fabricating the same.

This and other advantages of the present invention will become apparent to those skilled in the art upon reading and understanding the following detailed description with reference to the accompanying figures.

BRIEF DESCRIPTION OF THE DRAWINGS

FIGS. 5A to 5D are sectional views illustrating a process procedure for fabricating the semiconductor device shown in FIG. 4.

FIG. 14A shows a layout of a two-stage CMOS inverter using a metal interconnection and a dual-polycide interconnection; and FIG. 14B shows a layout of a two-stage CMOS inverter using a metal interconnection.

DESCRIPTION OF THE PREFERRED EMBODIMENTS

Example 1

Figure 1:
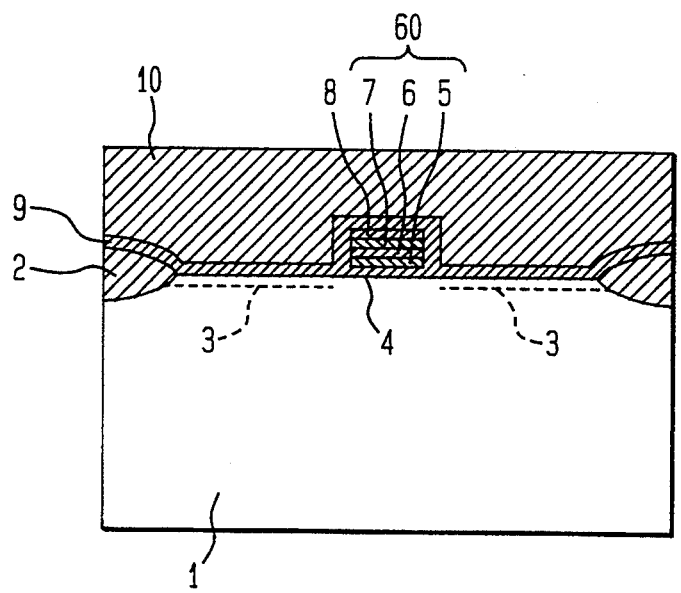
FIG. 1 is a sectional view showing a semiconductor device according to an example of the invention.

FIG. 1 shows a sectional view showing part of a semiconductor device according to the invention. For the sake of simplicity, a single MOS transistor is shown in FIG. 1. Actually, in the semiconductor device of the invention, a plurality of MOS transistors are formed at one and the same semiconductor substrate. The semiconductor device includes a silicon substrate 1, element isolating films 2 which are formed in element isolating regions at the surface of the silicon substrate 1, MOS transistors respectively formed in a plurality of element regions at the surface of the silicon substrate 1, a silicon oxide film 9 covering the MOS transistors, and an interlevel insulating film 10 of a BPSG film.

Each of the MOS transistors includes source and drain regions 3 formed in the silicon substrate 1 ($p^+$-type impurity diffused region extending from the surface of the silicon substrate 1 to the inside thereof), a gate oxide film 4 having a thickness of 10 nanometers (nm) formed on the silicon substrate 1, a gate electrode 60 formed on the gate oxide film 4, and a silicon oxide film 8 having a thickness of 200 nm formed on the gate electrode 60. The part of the silicon substrate 1 which is shown in FIG. 1 is an n-type well region formed in a p-type silicon substrate 1. Alternatively, the MOS transistors may be formed on an n-type silicon substrate.

The source and the drain regions 3 are located at a predetermined distance (for example, 500 nm) in the horizontal direction in FIG. 1. The region between the source and the drain regions 3 serves as a channel region of the MOS transistor. The gate electrode 60 covers the channel region via the gate oxide film 4. In the channel region, a conductive channel is formed for electrically connecting the source and the drain regions 3 depending on the potential of the gate electrode 60.

The gate electrode 60 in the semiconductor device has a sandwich-type three-layer polycide structure including a $p^+$-type first polysilicon film 5 having a thickness of 100 nm, a tungsten silicide film 6 having a thickness of 200 nm formed on the $p^+$-type first polysilicon film 5, and a $p^+$-type second polysilicon film 7 having a thickness of 100 nm formed on the tungsten silicide film 6. In more detail, the gate electrode 60 is a portion of a long polycide interconnection having the above polycide structure. In a semiconductor integrated circuit device having a plurality of MOS transistors, the polycide interconnection includes gate electrode portions of a group of transistors and a plurality of interconnection portions for connecting the gate electrode portions to each other. In this specification, the electrode portions and the interconnection portions having the polycide structure are collectively referred to as a polycide interconnection. The width of the polycide interconnection in this example is typically set to be 500 nm to 1000 nm. For realizing a fine-line configuration, the width may be made smaller.

The thickness of each of the films constituting the polycide interconnection is set to be an optional value appropriately selected in accordance with the design. A refractory metal silicide film sandwiched between the first and the second polysilicon films may be a film of refractory metal silicide other than tungsten silicide or a multi-layer film including films of various kinds of refractory metal silicide. The important point is that an insulating film is not disposed directly on the refractory metal silicide film.

The silicon oxide film 9 prevents impurities (boron and phosphorus) from diffusing from the BPSG film 10 to the silicon substrate 1. Instead of the silicon oxide film 9, a film having a diffusion barrier effect such as a silicon nitride film may be used.

The above-mentioned MOS transistor is a p-channel MOS transistor. An n-channel MOS transistor can be obtained by inverting the conductivity type of the impurities in the silicon substrate 1 and the source and the drain regions 3. The above-mentioned polycide interconnection is applicable to a CMOS (complementary MOS) semiconductor device. The CMOS semiconductor device has p-channel MOS transistors and n-channel MOS transistors on one and the same semiconductor substrate. Specifically, the CMOS semiconductor device includes, for example, a p-type silicon substrate and an n-well formed therein. In this case, the CMOS semiconductor device has an n-channel MOS transistor formed at the p-type silicon substrate and a p-channel MOS transistor formed at the n-well.

Figure 16:
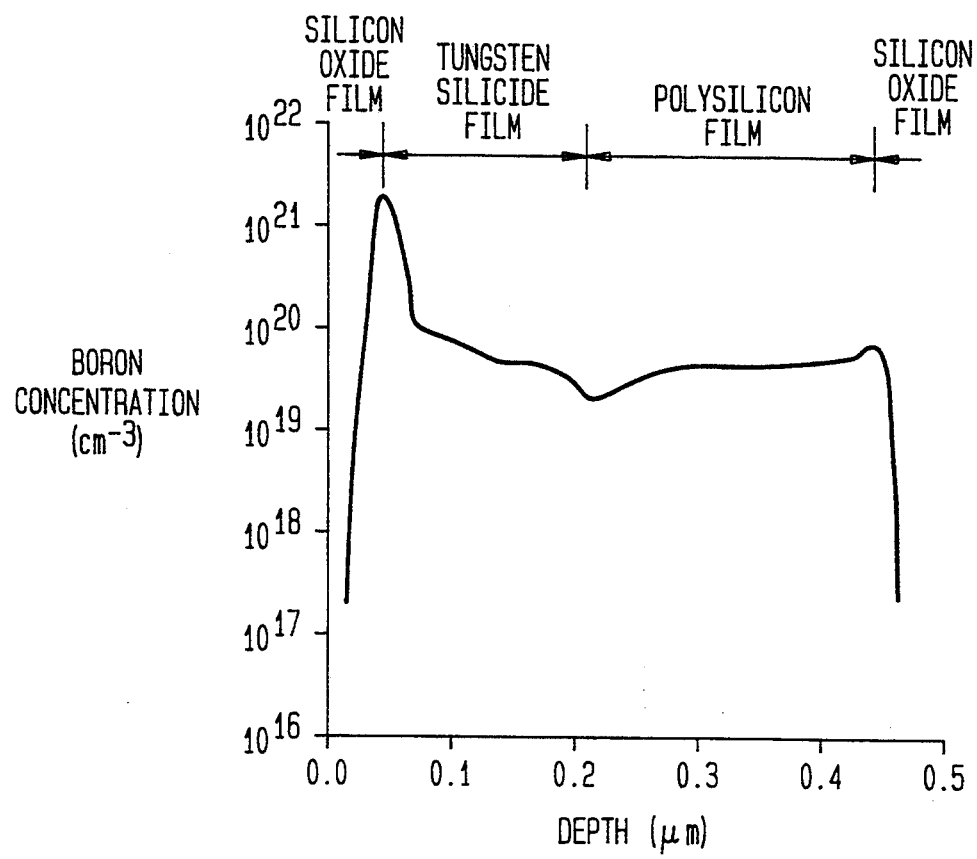
FIG. 16 is a characteristic graph showing a boron concentration distribution in a prior art two-layer polycide interconnection.

The main feature of the semiconductor device shown in FIG. 1 resides in that, since the $p^+$-type second polysilicon film 7 is disposed between the tungsten silicide film 6 and the silicon oxide film 8, the top surface of the tungsten silicide film 6 is not in direct contact with the silicon oxide film 8. FIG. 16 shows a boron concentration distribution in a multi-layer structure constituted by a silicon oxide film, a polysilicon film, a tungsten silicide film, and a silicon oxide film. In other words, FIG. 16 shows a boron concentration distribution in a structure in which a usual two-layer polycide structure consisting of a polysilicon film and a tungsten silicide film on the polysilicon film is sandwiched between silicon oxide films. As shown in FIG. 16, the boron concentration distribution has a peak at an interface between the silicon oxide film and the tungsten silicide film. This means that boron segregates at the interface. The boron segregation leads to the reduction in boron concentration in the tungsten silicide film and the polysilicon film. That is, the interface between the tungsten silicide film and the polysilicon film functions as a sink for "absorbing" boron in the polycide interconnection.

On the other hand, a boron segregation does not occur at an interface between the tungsten silicide film and the polysilicon film. This may be because when crystal grains of the tungsten silicide film are grown by annealing, mismatching occurs between the tungsten silicide film and the silicon oxide film, while such mismatching rarely occurs between the tungsten silicide film and the polysilicon film.

The concentration distribution shown in FIG. 16 was obtained by conducting secondary ion mass spectrometry (SIMS) for a sample having the above-mentioned structure. The sample was fabricated in the following manner. First, after a silicon oxide film and a polysilicon film were successively formed on a silicon substrate, boron ions were implanted into the polysilicon film. Then, after a tungsten silicide film and a silicon oxide film were successively formed on the polysilicon film, annealing was performed at 900° C. for 30 minutes. By this annealing, the boron in the polysilicon film is diffused to the interface between the tungsten silicide film and the silicon oxide film.

According to the example of the invention shown in FIG. 1, an area of the interface between the tungsten silicide film 6 and the silicon oxide film 9 (i.e., an area of the side face of the tungsten silicide film 6) is small so it can be substantially disregarded, as compared to the area of the interface between the tungsten silicide film 6 and the silicon oxide film 8 in the prior art semiconductor device. In this example of the invention, the area of the interface to which boron is likely to segregate (i.e., the interface between the silicide and the insulating film) is remarkably reduced, so that the boron in the $p^+$-type second polysilicon film 7 and the tungsten silicide film 6 is prevented from segregating to the above interface. Accordingly, the boron concentration in the interconnection is prevented from decreasing due to the boron segregation.

As another preferred example, not only the upper face of the tungsten silicide film 6 but also the side face thereof may be covered with the $p^+$-type second polysilicon film 7. In such an example, the tungsten silicide film 6 is completely covered with the polysilicon film, so that there is no interface between the tungsten silicide film and the silicon oxide film. As a result, the boron segregation does not occur due to the presence of interface, and the boron concentration in the interconnection is prevented from decreasing due to the segregation.

Figure 2A:
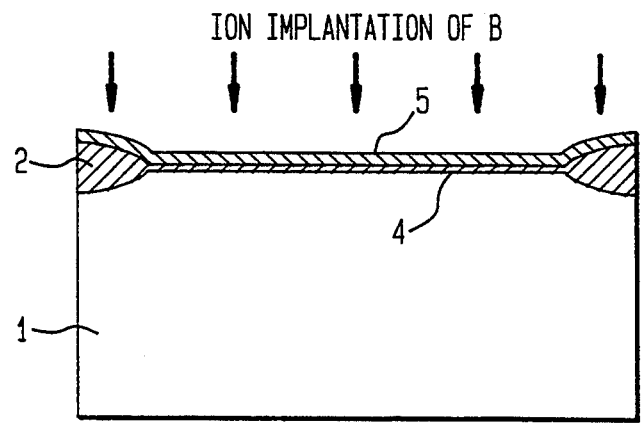
FIGS. 2A to 2C are sectional views illustrating a process procedure for fabricating the semiconductor device shown in FIG. 1.
Figure 2B:
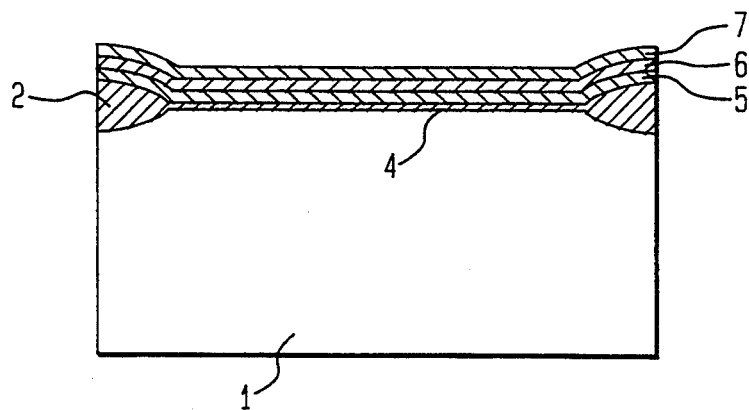
Figure 2C:
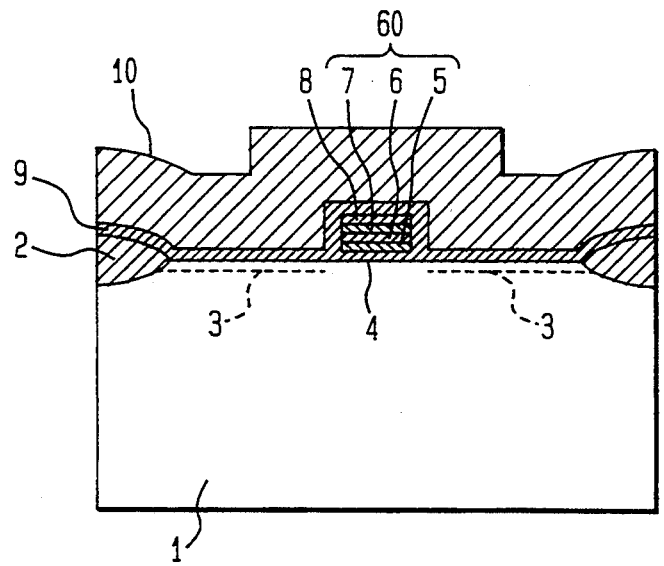

Referring to FIGS. 2A to 2C, a method of fabricating the above semiconductor device will be described below. First, the element isolating film 2 is formed in the element isolating region at the surface of the silicon substrate 1 by a conventional local oxidation of silicon (LOCOS) method. The element isolating film 2 may be formed by a method other than the LOCOS method. The region in which the element isolating film 2 is not formed is an element region. By oxidizing the surface of each element region in the silicon substrate 1, the gate oxide film 4 is formed on the respective element region.

After a polysilicon film is deposited so as to cover the gate oxide film 4 by low-pressure chemical vapor deposition (LPCVD), as is shown in FIG. 2A, boron ions as the p-type impurities are implanted into the polysilicon film at an acceleration energy of 20 keV and at a dose of $6 \times 10^{15}$ cm$^{-2}$. Thus, the p+-type first polysilicon film 5 is formed.

Then, as is shown in FIG. 2B, after the tungsten silicide film 6 is formed on the p+-type first polysilicon film 5, another polysilicon film is deposited. Then, boron ions are implanted into the polysilicon film at an acceleration energy of 20 keV and at a dose of $6 \times 10^{15}$ cm$^{-2}$. Thus, the p+-type polysilicon film 7 is formed on the tungsten silicide film 6.

Next, the silicon oxide film 8 is deposited on the p+-type second polysilicon film 7. The multi-layer film constituted by the first polysilicon film 5, the tungsten silicide film 6, the second polysilicon film 7 and the silicon oxide film 8 is patterned into a desired interconnection shape using known lithographic and etching techniques. Thus, as is shown in FIG. 2C, the polycide interconnection (the gate electrode 60) is obtained which has a three-layer structure of the first polysilicon film 5, the tungsten silicide film 6 and the second polysilicon film 7.

Then, boron ions are implanted into the element region in the silicon substrate 1 at an acceleration energy of 10 keV and at a dose of $6 \times 10^{15}$ cm$^{-2}$ using the element isolating film 2 and the gate electrode 60 as a mask. The regions into which the boron ions are implanted are annealed, so as to be the source and the drain regions 3 of an MOS transistor. Since a region to be a channel of the MOS transistor is covered with the gate electrode 60, boron ions are not implanted into the region. Thus, the channel region and the source and the drain regions 3 are formed in self-alignment with respect to the gate electrode 60. The silicon oxide film 8 can serve as an etching mask in a step for etching the second polysilicon film 7 or the like, but the silicon oxide film 8 is not necessarily required for the invention.

Alternatively, a side wall spacer may be formed on the side face of the gate electrode 60, prior to the ion implantation for forming the source and the drain regions 3. Another ion implantation may be performed in order to form a lightly doped drain (LDD) region, prior to the formation of the side wall spacer. Since the short channel effect can be suppressed by forming the LDD region, the MOS transistor can be further miniaturized. By miniaturizing the MOS transistor, the operation speed of the transistor can be improved, and the integration degree of the semiconductor device including a number of such transistors can be improved.

Next, after the silicon oxide film 9 is deposited so as to cover the transistor, the BPSG film 10 is deposited on the silicon oxide film 9. Then, annealing is performed in a nitrogen atmosphere at 900° C. for 30 minutes, in order to planarize the surface of the BPSG film 10, and simultaneously to activate the impurities. The annealing conditions can be established appropriately. After contact holes (not shown) are formed at predetermined portions in the BPSG film 10, an interconnection which connects the polycide interconnection to the source and the drain regions 3 is formed on the BPSG film 10.

According to this example, the boron concentration in the polycide interconnection (the gate electrode 60) is prevented from decreasing due to the annealing, so that the threshold voltage of the MOS transistor does not vary. The MOS transistor in this example can be used as a switching transistor in a memory cell included in a semiconductor memory device such as a dynamic random access memory (DRAM). In other words, the above-mentioned polycide interconnection having the three-layer structure can be used as a word line in the DRAM.

Example 2

Figure 3:
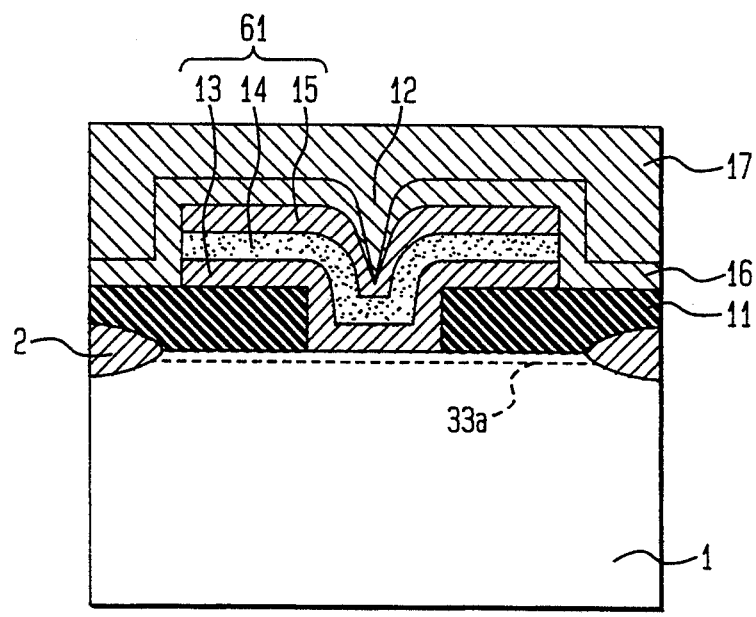
FIG. 3 is a sectional view showing a semiconductor device according to another example of the invention.

FIG. 3 is a sectional view showing a portion of the semiconductor device according to another example of the invention. In the semiconductor device shown in FIG. 1, the polycide interconnection having the three-layer structure is used as the gate electrodes of the MOS transistors and the interconnection for connecting the gate electrodes to each other. However, in the semiconductor device of this example, a polycide interconnection having a three-layer structure is used as an interconnection which is in contact with a p-type impurity diffused region in a semiconductor substrate 1. In other words, the polycide interconnection shown in FIG. 3 can be used, for example, as a bit line in a DRAM.

The semiconductor device in this example includes a silicon substrate 1 (in which n-type impurities are diffused), an element isolating film 2 formed in each element isolating region at the surface of the silicon substrate 1, a p-type impurity diffused region 33a formed in each of a plurality of element regions at the surface of the silicon substrate 1, an interlevel insulating film 11 formed on the silicon substrate 1, contact holes 12 formed in the interlevel insulating film 11, and a polycide interconnection 61 which is in contact with the p-type impurity diffused region 33a via the contact holes 12.

The polycide interconnection 61 in this example includes a p+-type first polysilicon film 13 having a thickness of 100 nm, a tungsten silicide film 14 having a thickness of 200 nm formed on the p+-type first polysilicon film 13, and a p+-type second polysilicon film 15 having a thickness of 200 nm formed on the tungsten silicide film 14.

The semiconductor device further includes a silicon oxide film 16 formed on the interlevel insulating film 11 so as to cover the polycide interconnection 61, and a BPSG film 17 formed on the silicon oxide film 16.

According to this example, since the polycide interconnection 61 has substantially no interface between the tungsten silicide film 14 and the silicon oxide film 16, the boron concentration in the polycide interconnection 61 does not decrease after an annealing step. As a result, boron is prevented from diffusing from the p-type impurity diffused region 33a in the silicon substrate 1 into the polycide interconnection 61. Thus, the boron concentration in the p-type impurity diffused region 33a of the silicon substrate 1 and in the first polysilicon film 13 is prevented from decreasing. For this reason, the contact resistance between the polycide interconnection 61 and the p-type impurity diffused region 33a can be maintained low.

Now, a method of fabricating the above-described semiconductor device is described. First, the element isolating film 2 is formed in the element isolating region at the surface of the silicon substrate 1. The region where the element isolating film 2 is not formed is an element region. Thereafter, boron is implanted into the element region of the silicon substrate 1 at an accelerate energy of 10 keV at a dose of $6 \times 10^{15}$ cm$^{-2}$ using the element isolating film 2 as a mask. The region into which the boron ions are implanted is annealed, so as to be the p-type impurity diffused region 33a.

Then, after the interlevel insulating film 11 is deposited so as to cover the element region, the contact holes 12 are formed in the interlevel insulating film 11 using the conventional lithographic and etching techniques. After a natural oxide film which is present at the bottom of the contact hole 12 is removed by dipping using a solution containing hydrofluoric acid, the polycide interconnection 61 is formed in the same manner as in the formation of the polycide interconnection in the semiconductor device shown in FIG. 1.

After the silicon oxide film 16 and the BPSG film 17 are deposited, annealing is performed in a nitrogen atmosphere at 900° C. for 30 minutes, in order to planarize the surface of the BPSG film 17, and to activate the impurities. Then, after contact holes (not shown) which reach the polycide interconnection 61 are formed in the BPSG film 17 and the silicon oxide film 16, an interconnection which is connected to the polycide interconnection 61 via the contact holes is formed on the BPSG film 17.

Alternatively, the MOS transistor shown in FIG. 1 may be formed in the element region, prior to the formation of the interlevel insulating film 11. In this case, one of the source and the drain regions 3 of the MOS transistor shown in FIG. 1 corresponds to the p-type impurity diffused region 33a shown in FIG. 3. In the case where a semiconductor device having the MOS transistor of FIG. 1 and the polycide interconnection of FIG. 3 is applied to a DRAM, both of the word line and the bit line of the DRAM may be formed using the polycide interconnection of three-layer structure. In another application, a DRAM has a word line having a conventional structure, and a bit line only that is the polycide interconnection 61 shown in FIG. 3.

Example 3

Figure 4:
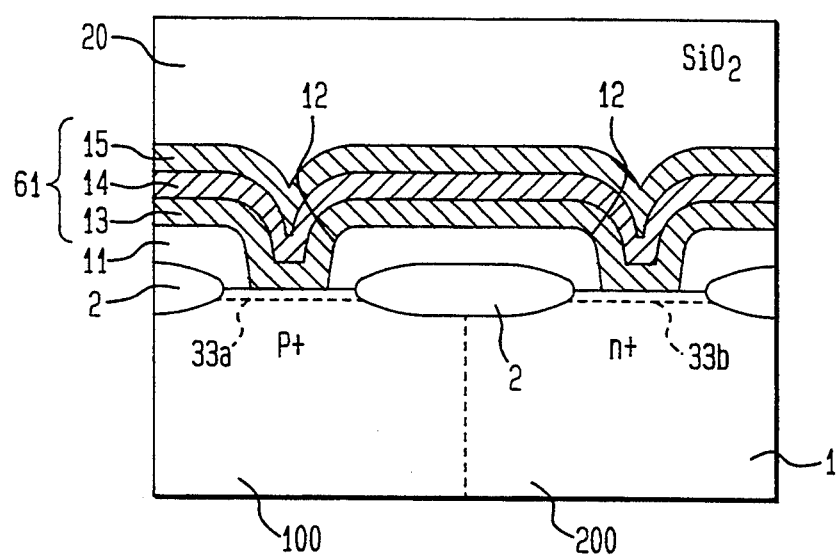
FIG. 4 is a sectional view showing a semiconductor device according to still another example of the invention.

FIG. 4 is a sectional view showing a portion of a semiconductor device according to another example of the invention. In the semiconductor device of this example, a polycide interconnection 61 of three-layer structure is used as an interconnection which is in contact with a p-type impurity diffused region 33a and an n-type impurity diffused region 33b in a silicon substrate 1. The polycide interconnection which is in contact with both the p-type impurity diffused region and the n-type impurity diffused region in the silicon substrate 1 is referred to as a dual-polycide interconnection. Preferably, the dual-polycide interconnection shown in FIG. 4 can be used as an interconnection in a CMOS semiconductor device.

The semiconductor device of this example includes the silicon substrate 1, an n-well 100 and a p-well 200 formed in the silicon substrate 1, an element isolating film 2 formed in each element isolating region at the surface of the silicon substrate 1, a p-type impurity diffused region 33a formed in the n-well 100, an n-type impurity diffused region 33b formed in the p-well 200, an interlevel insulating film 11 formed on the silicon substrate 1, contact holes 12 formed in the interlevel insulating film 11, and the polycide interconnection 61 formed on the interlevel insulating film 11 and which is in contact with the p-type impurity diffused region 33a and the n-type impurity diffused region 33b via the contact holes 12.

The polycide interconnection 61 of this example includes a p$^+$-type first polysilicon film 13 having a thickness of 100 nm, a tungsten silicide film 14 having a thickness of 200 nm formed on the p$^+$-type first polysilicon film 13, and a p$^+$-type second polysilicon film 15 having a thickness of 200 nm formed on the tungsten silicide film 14.

Since FIG. 4 is a sectional view taken along the direction in which the polycide interconnection 61 extends, the polycide interconnection 61 completely covers the interlevel insulating film 11 in FIG. 4. However, actually, the polycide interconnection 61 having a wiring shape is present on a predetermined region of the interlevel insulating film 11. The semiconductor device of this example further includes another interlevel insulating film 20 formed on the interlevel insulating film 11 so as to cover the polycide interconnection 61. The interlevel insulating film 20 may be a layered film having a BPSG film and the like.

Figure 5A:
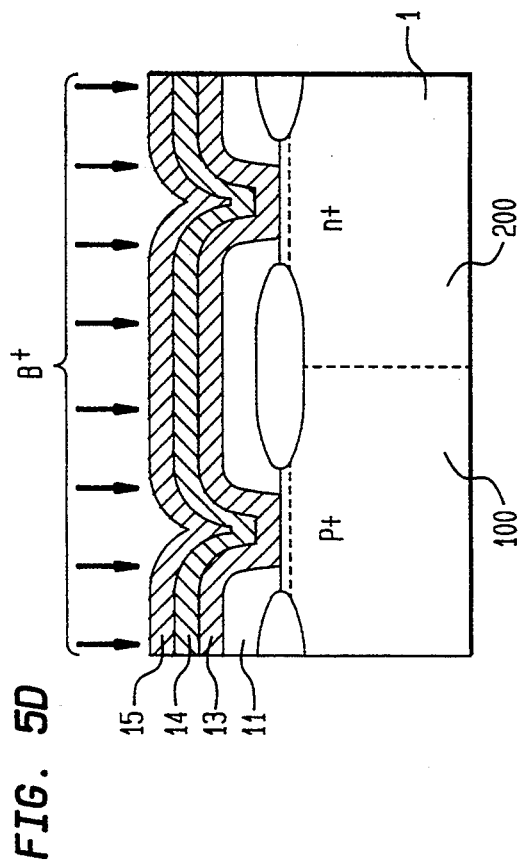

Referring to FIGS. 5A through 5D, a method of fabricating the above-described semiconductor device is described. First, in the element isolating region at the surface of the semiconductor substrate 1 in which the p-well 200 and the n-well 100 are formed using a known technique, the element isolating film 2 is formed by the LOCOS method. As is shown in FIG. 5A, since there exists a pn junction in each of the wells 100 and 200, arsenic ions (as n-type impurities) are implanted into the p-well 200 and BF$_2$ ions (as p-type impurities) are selectively implanted into the n-well 100. The arsenic ions and the BF$_2$ ions are implanted at an acceleration energy 40 keV and at a dose of $6 \times 10^{15}$ cm$^{-2}$, respectively. The region into which the arsenic ions are implanted becomes the n-type impurity diffused region 33b, and the region into which the BF$_2$ ions are implanted becomes the p-type impurity diffused region 33a.

Figure 5D:
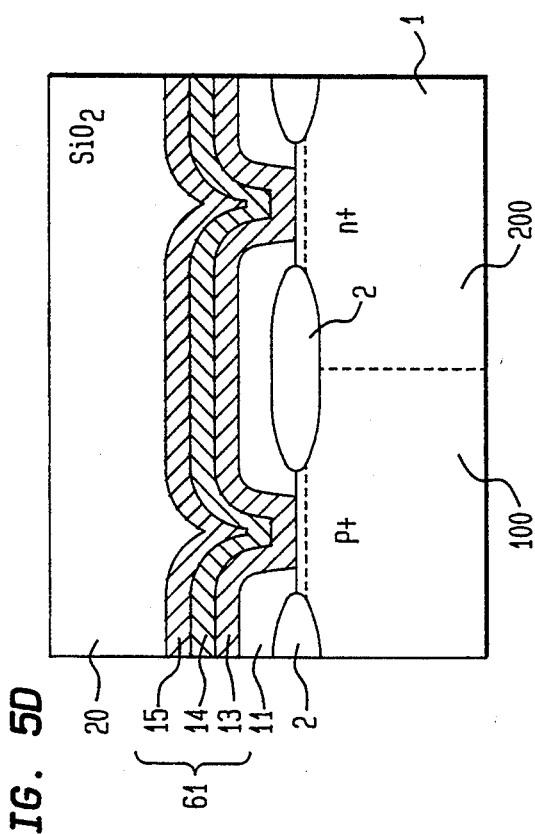
Figure 5B:
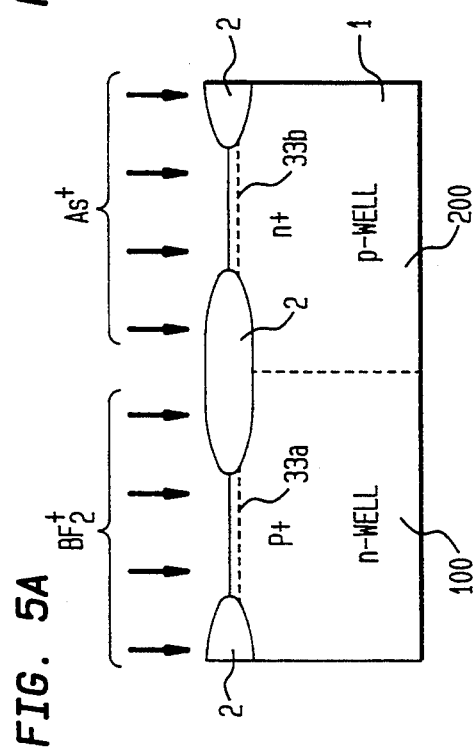
Figure 5D:
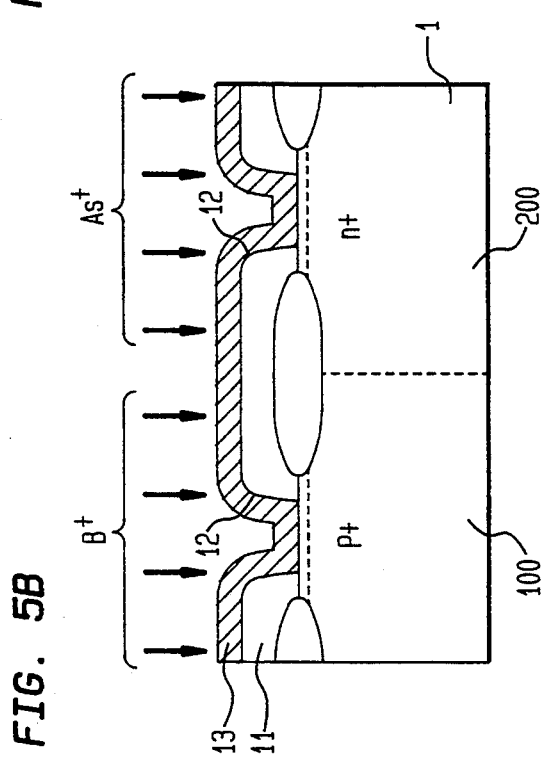

Then, as is shown in FIG. 5B, the interlevel insulating film 11 having a thickness of 300 nm and consisting of a silicon oxide film is deposited on the semiconductor substrate 1 by LPCVD. The contact holes 12 which reach the n-type impurity diffused region 33b and the p-type impurity diffused region 33a formed in the corresponding wells 100 and 200 are formed in the interlevel insulating film 11 using the conventional lithographic and etching techniques. Each of the contact holes 12 has, for example, a diameter of 300 nm.

Then, the first polysilicon film 13 having a thickness of 50 nm is deposited on the interlevel insulating film 11 by LPCVD. Thereafter, boron ions are selectively implanted into a portion of the first polysilicon film 13. The boron ions are implanted at an acceleration energy of 15 keV and at a dose of $6 \times 10^{15}$ cm$^{-2}$. Arsenic ions are selectively implanted into another portion of the first polysilicon film 13. The arsenic ions are implanted at an acceleration energy of 80 keV and at a dose of $1 \times 10^{15}$ cm$^{-2}$. The order of the implantation of the boron ions and the arsenic ions may be reversed with respect to this example. The portion of the first polysilicon film 13 into which the boron ions are implanted is in contact with the p-type impurity diffused region 33a in the n-well 100. The portion of the first polysilicon film 13 into which the arsenic ions are implanted is in contact with the n-type impurity diffused region 33b in the p-well 200.

Next, as is shown in FIG. 5C, after the tungsten silicide film 14 having a thickness of 100 nm is deposited on the first polysilicon film 13 by sputtering, the second polysilicon film 15 having a thickness of 50 nm is deposited on the tungsten silicide film 14 by LPCVD. Thereafter, boron ions are implanted over the entire second polysilicon film 15 at an acceleration energy of 30 keV and at a dose of $6 \times 10^{15}$ cm$^{-2}$.

As is shown in FIG. 5D, the three-layer film consisting of the second polysilicon film 15, the tungsten silicide film 14 and the first polysilicon film 13 are patterned into a wiring shape using the conventional lithographic and etching techniques, so as to form the three-layer dual-polycide interconnection 61. The interlevel insulating film 20 of the silicon oxide film is deposited on the interlevel insulating film 11 so as to cover the dual-polycide interconnection 61. Then, annealing is performed in a nitrogen atmosphere for a time period of 10 to 90 minutes at 900° C. Thus, a semiconductor device shown in FIG. 4 is completed.

Figure 6:
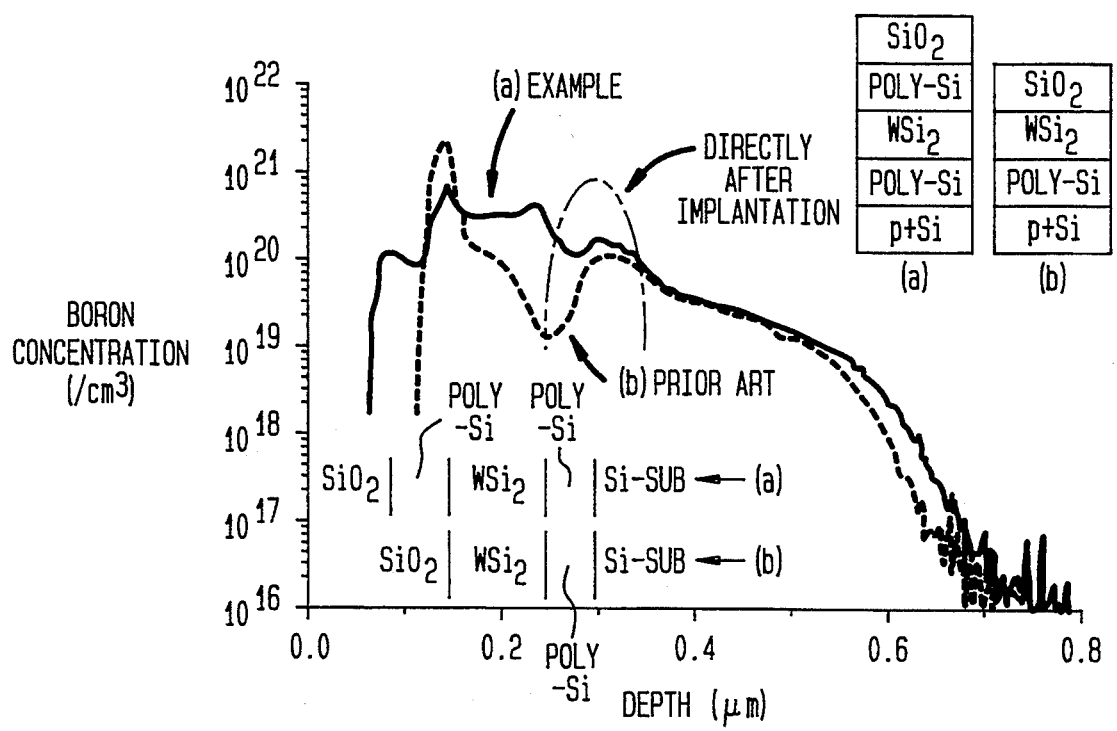
FIG. 6 is a characteristic graph showing a boron concentration distribution in a polycide interconnection which is in contact with a semiconductor substrate.

FIG. 6 shows a boron concentration (cm$^{-3}$) distribution in a depth direction in the sandwich-type three-layer polycide structure consisting of a first polysilicon (Poly-Si) film, a tungsten silicide (WSi$_2$) film, and a second polysilicon (Poly-Si) film. This polycide structure is formed on a silicon substrate (Si-sub) and is covered with a silicon oxide (SiO$_2$) film. The impurity concentration distribution shown in FIG. 6 is obtained by SIMS. For comparison, FIG. 6 also shows the impurity concentration distribution in a depth direction in a conventional two-layer polycide structure consisting of a polysilicon film and a tungsten silicide film. The respective polycide structures are schematically shown in FIG. 6. After boron ions are implanted into the polysilicon film at the lowermost position of each of the polycide structures at an acceleration energy of 15 keV and at a dose of $6 \times 10^{15}$ cm$^{-2}$, an annealing step is performed at 900° C. for 60 minutes. In FIG. 6, the boron concentration distribution prior to the annealing step (directly after the implantation) is shown by a two-dot chain line.

As seen from FIG. 6, the boron concentration in the first polysilicon film in the sandwich-type three-layer structure has a higher value by one figure than the boron concentration in the polysilicon film in the conventional polycide structure. This is because the sandwich-type three-layer polycide structure substantially has no interface between the tungsten silicide film and the silicon oxide film, so that the boron will not segregate to such an interface, i.e., the boron will not be "absorbed" by such an interface.

On the other hand, in the conventional two-layer polycide structure, there exists an interface between the polysilicon film and the silicon oxide film. The boron concentration at this interface exceeds $10 \times 10^{21}$ cm$^{-3}$. This indicates that boron segregates at the interface. Such boron segregation leads to a reduction in boron concentration in the two-layer polycide structure.

Figure 17:
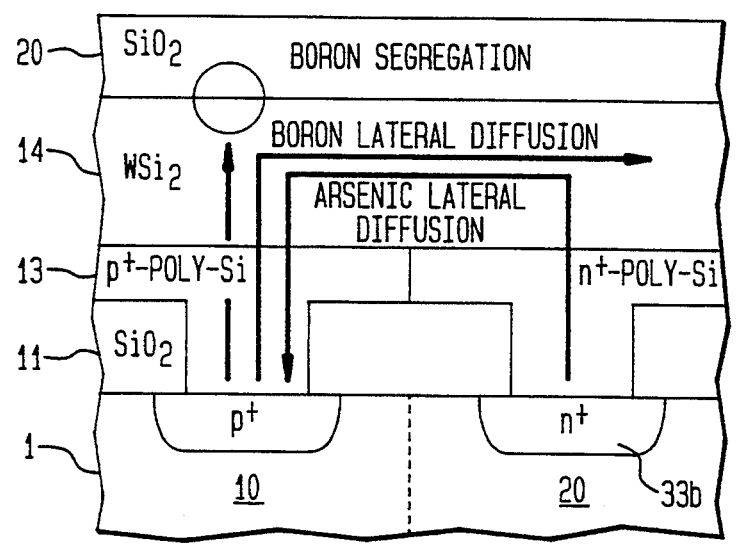
FIG. 17 is a schematic view showing the impurity diffusion and segregation in the prior art two-layer polycide interconnection.

FIG. 17 schematically shows a dual-polycide interconnection having the conventional two-layer structure. The dual-polycide interconnection is constituted by the polysilicon film 13 and the tungsten silicide film 14. The polycide interconnection is formed on the interlevel insulating film 11 which covers the silicon substrate 1, and is in contact with an n$^+$-type impurity diffused region and a p$^+$-type impurity diffused region in the silicon substrate via contact holes which are formed in the interlevel insulating film 11. The polycide interconnection is covered with the silicon oxide film 20.

In such a polycide interconnection, a boron segregation occurs at the interface between the silicon oxide film 20 and the tungsten silicide film 14. Moreover, a contact resistance between the polycide interconnection and the impurity diffused regions may be increased or varied due to the lateral diffusion of boron and arsenic.

Figure 7:
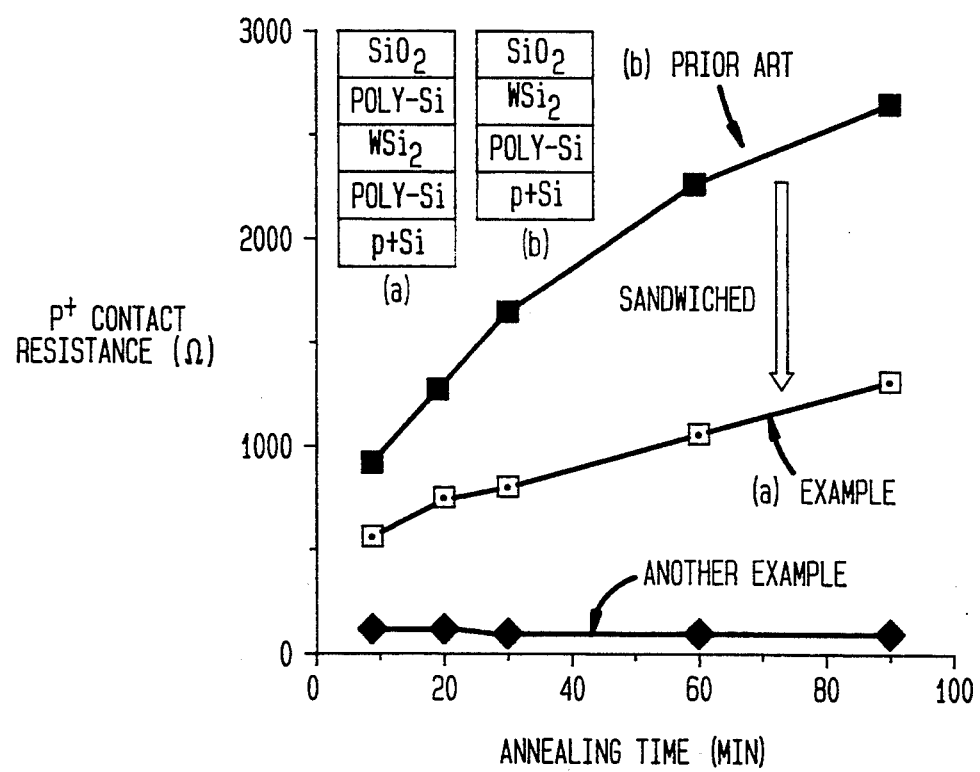
FIG. 7 is a characteristic graph showing a dependency of p-type contact resistance on an annealing time.

FIG. 7 shows a contact resistance between the p$^+$-type polycide interconnection and the p-type impurity diffused region in the semiconductor substrate. A contact resistance of the conventional polycide interconnection (prior art) is indicated by a solid square, and a contact resistance of the sandwich-type three-layer polycide interconnection (example) is indicated by an open square. Boron is not implanted into the second polysilicon film of the sandwich-type three-layer polycide interconnection. A contact resistance of the sandwich-type polycide interconnection in which boron is implanted over the entire second polysilicon film (another example) is indicated by a solid diamond.

As seen from FIG. 7, the contact resistance of the sandwich-type three-layer polycide interconnection according to the invention is reduced to a half as compared with the contact resistance of the conventional polycide interconnection. Generally, the contact resistance between the p$^+$-type polycide interconnection and the p$^+$-type impurity diffused region in the semiconductor substrate largely depends on the impurity concentration in the lowermost polysilicon film in the polycide interconnection and the p$^+$-type impurity diffused region. In the polycide interconnection according to the present invention, the boron concentration is prevented from decreasing due to the boron segregation, so that a low contact resistance can be attained as is shown in FIG. 7. Especially, the sandwich-type three-layer polycide interconnection in which boron is implanted over the entire second polysilicon film has an advantage that the contact resistance does not depend on the annealing time. This advantage prevents the contact resistance from being varied with the variation in process conditions.

Figure 8:
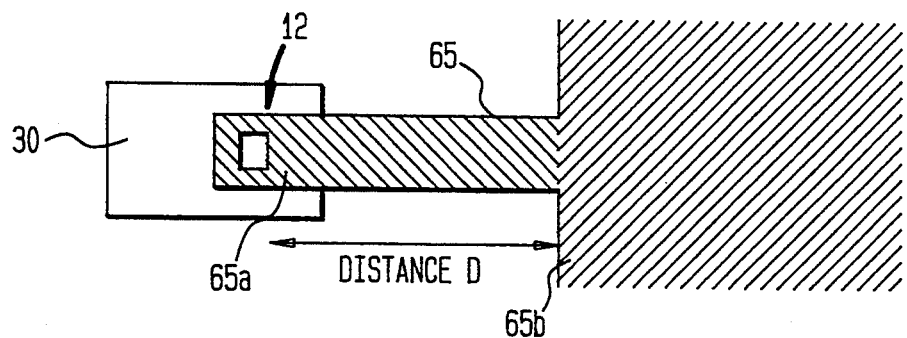
FIG. 8 is a plan view showing a sample for estimating a lateral diffusion.

As described above, the characteristics of the sandwich-type three-layer polycide interconnection according to the invention relate to the impurity movement (diffusion) across the interface in the polycide interconnection, i.e., relates to the impurity redistribution in a vertical direction (a depth direction). However, in order to estimate the characteristics of the dual-polycide interconnection, it is necessary to observe the impurity movement (diffusion) along the interface in the polycide interconnection, i.e., the impurity redistribution in a lateral direction. FIG. 8 shows a plan layout of a sample for evaluating the impurity redistribution in the lateral direction. This sample has a sandwich-type three-layer polycide interconnection 65 having a first arsenic-doped portion 65b and a second boron-doped portion 65a. The second portion 65a of the polycide interconnection 65 is in contact with a p$^+$-type impurity diffused region 30 in the semiconductor substrate via the contact hole 12. The first portion 65b has a sufficiently larger volume as compared with the second portion 65a. The distance from the first portion 65b to the contact portion is denoted by a distance D. A plurality of samples having various distances D are fabricated, and annealed at 900° C. for 90 minutes. After the annealing, a contact resistance is measured for each of the samples.

Figure 9:
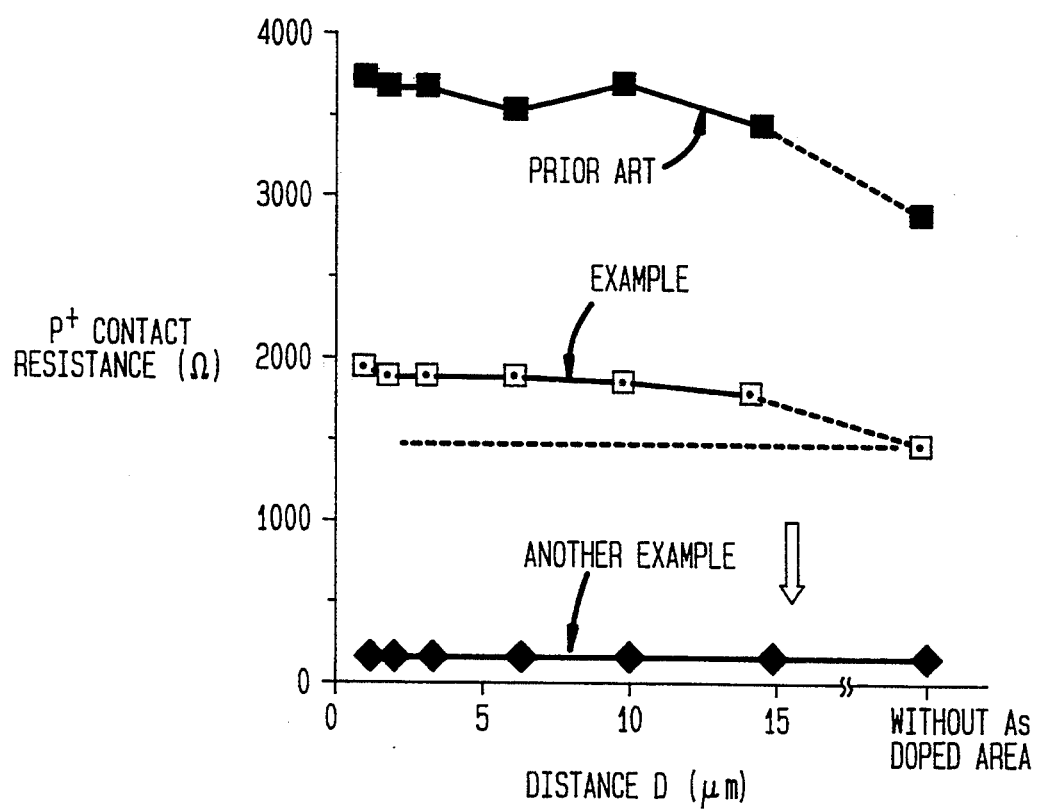
FIG. 9 is a characteristic graph showing a relationship between a distance D in the sample of FIG. 8 and the p-type contact resistance.
Figure 10:
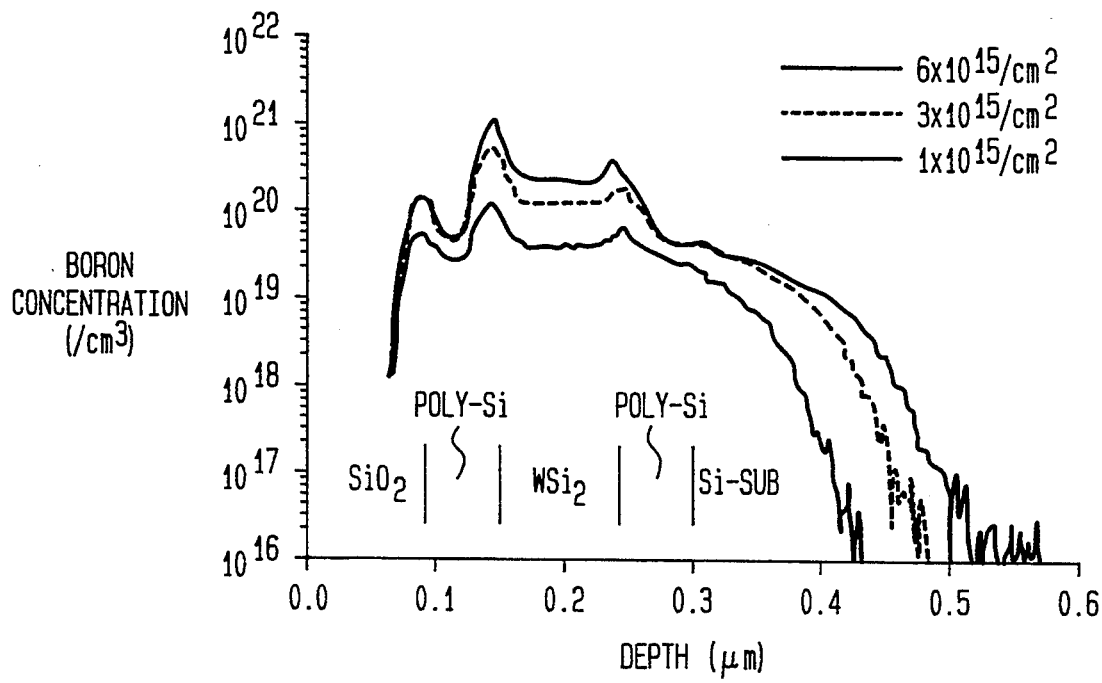
FIG. 10 is a characteristic graph showing a boron concentration distribution in a polycide interconnection.
Figure 11:
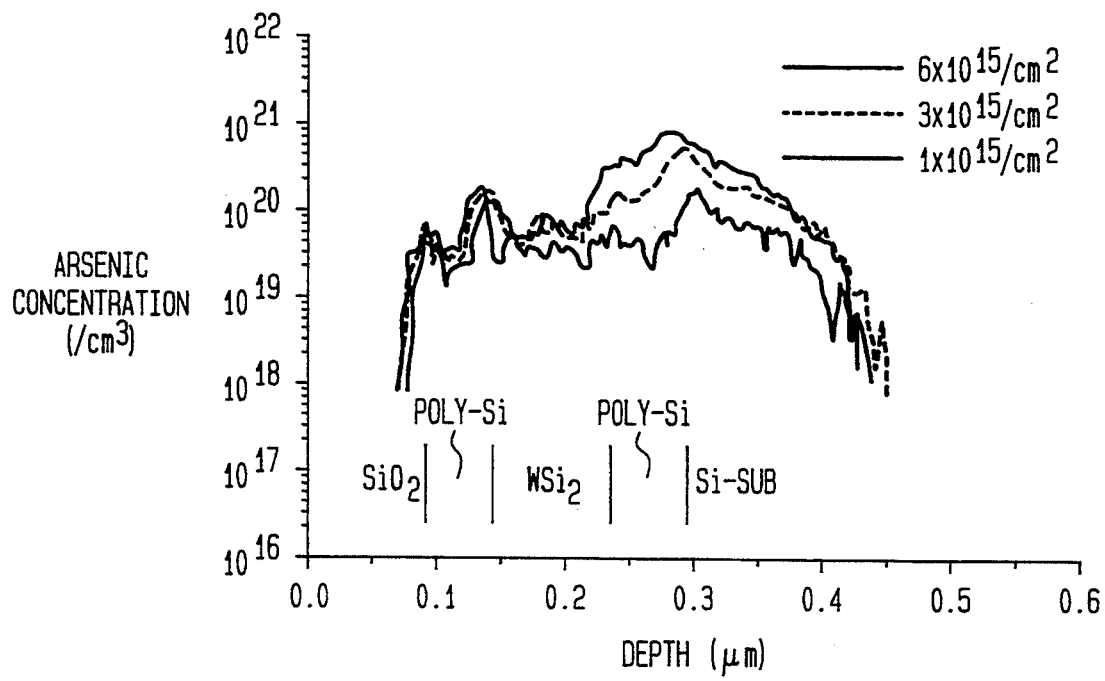
FIG. 11 is a characteristic graph showing an arsenic concentration distribution in the polycide interconnection.

FIG. 9 shows the relationship between the contact resistance and the distance D. As to samples except for the sample which is provided with the sandwich-type three-layer polycide interconnection in which boron is implanted over the entire second polysilicon film, a smaller distance D has a higher contact resistance. On the other hand, the sample which is provided with the sandwich-type three-layer polycide interconnection in which boron is implanted over the entire second polysilicon film, the contact resistance remains low without depending on the distance D. This means that, in the sample which is provided with the sandwich-type three-layer polycide interconnection in which boron is implanted over the entire second polysilicon film, the lateral boron diffusion from the contact portion to the first portion 65b is suppressed. FIG. 10 shows how the boron redistributes by an annealing step at 900° C. for 30 minutes in the sandwich-type polycide structure in which arsenic is implanted into the second polysilicon film with respective doses of $1 \times 10^{15}$, $3 \times 10^{15}$, and $6 \times 10^{15}$ cm$^{-2}$. FIG. 11 shows how the arsenic redistributes by an annealing step at 900° C. for 30 minutes in the sandwich-type polycide structure in which arsenic is implanted into the first polysilicon film with respective doses of $1 \times 10^{15}$, $3 \times 10^{15}$, and $6 \times 10^{15}$ cm$^{-2}$.

As seen from FIGS. 10 and 11, the amount of boron in the tungsten silicide film is larger than that in the second polysilicon film. On the other hand, the amount of arsenic in the first polysilicon film is larger than that in the tungsten silicide film. According to these facts, the following points are found.

(1) In the n-type polycide region in the dual-polycide interconnection, boron implanted into the second polysilicon film is likely to remain in the second polysilicon film and not likely to move to the tungsten silicide film. Therefore, the boron which is implanted into the second polysilicon film does not have a detrimental influence on the contact characteristic between the n-type polycide portion and the n-type impurity diffused region.

Moreover, (2) since the boron is implanted over the entire top surface of the second polysilicon film, the boron in the second polysilicon film and the boron which is diffused into the tungsten silicide film is uniformly distributed in a lateral direction. Therefore, the lateral boron diffusion in the second polysilicon film and the tungsten silicide film can be suppressed. As a result, the boron at the contact portion between the p-type polycide region and the p-type impurity diffused region is prevented from moving from the p-type polycide region in the second polysilicon film to the n-type polycide region through the tungsten silicide film.

Moreover, (3) in the n-type polycide region of the dual-polycide interconnection, the arsenic in the first polysilicon film is difficult to move into the tungsten silicide film. Furthermore, the arsenic in the first polysilicon film is difficult to move in a lateral direction as compared to the arsenic ions in the tungsten silicide film. Therefore, the arsenic is prevented from moving from the contact portion between the n-type polycide region and the n-type impurity diffused region due to the vertical and lateral diffusion. Accordingly, the arsenic concentration is prevented from decreasing at the contact portion between the n-type polycide region and the n-type impurity diffused region. Thus, the contact resistance between the n-type polycide region and the n-type impurity diffused region is difficult to deteriorate.

Figure 13:
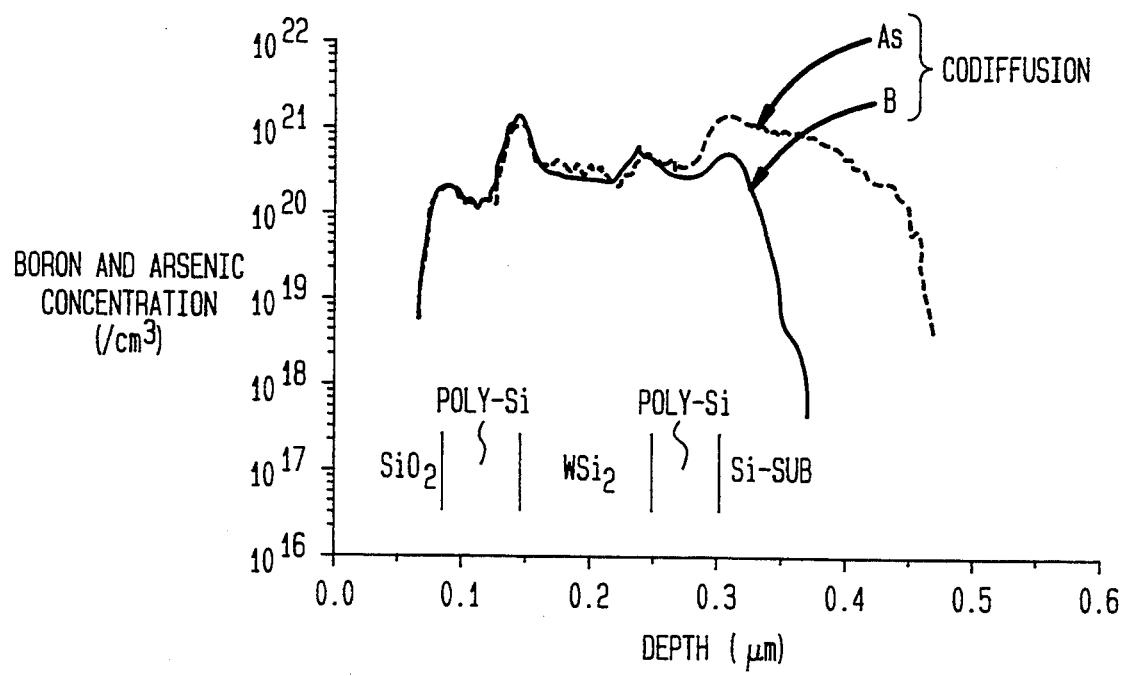
FIG. 13 is a characteristic graph showing an impurity concentration distribution in a three-layer polycide interconnection.

Boron has a property in that it is not diffused into an impurity diffused region having a high arsenic concentration. FIG. 13 shows a boron concentration and an arsenic concentration in the sandwich-type three-layer polycide interconnection in a depth direction. In more detail, FIG. 13 shows an impurity concentration distribution after annealing the polycide interconnection in which arsenic ions are implanted into the first polysilicon film and boron ions are implanted into the second polysilicon film at 900° C. for 30 minutes. As seen from FIG. 13, the boron is hardly diffused to the silicon substrate, and the arsenic concentration in the first polysilicon film is maintained to be high.

Figure 12:
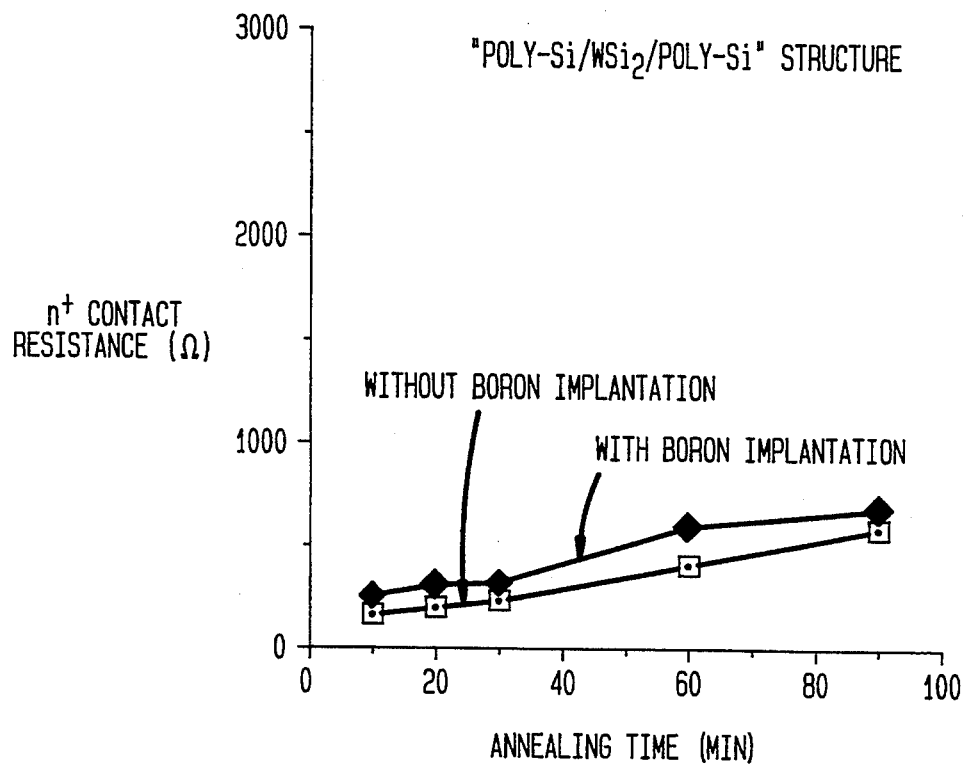
FIG. 12 is a characteristic graph showing a dependency of n-type contact resistance on an annealing time.

In order to show that the boron ions which are implanted into the second polysilicon film have no detrimental influence on the contact resistance between the n-type polycide region and the n-type impurity diffused region, the n-type contact resistance between the sandwich-type three-layer polycide interconnection and the n-type impurity diffused region is measured. FIG. 12 is a graph showing the influence of the boron implantation into the second polysilicon film on the anneal time dependency of the contact resistance. As seen from FIG. 12, the n-type contact resistance is not increased by the boron implantation into the second polysilicon film. The annealing is performed at 900° C.

Example 4

Figure 15B:
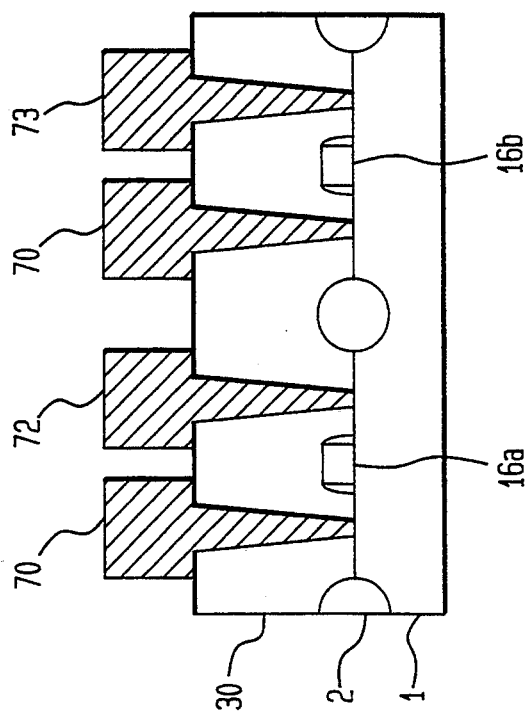
FIGS. 15A and 15B are sectional views of the two-stage CMOS inverters of FIGS. 14A and 14B, respectively.
Figure 15A:
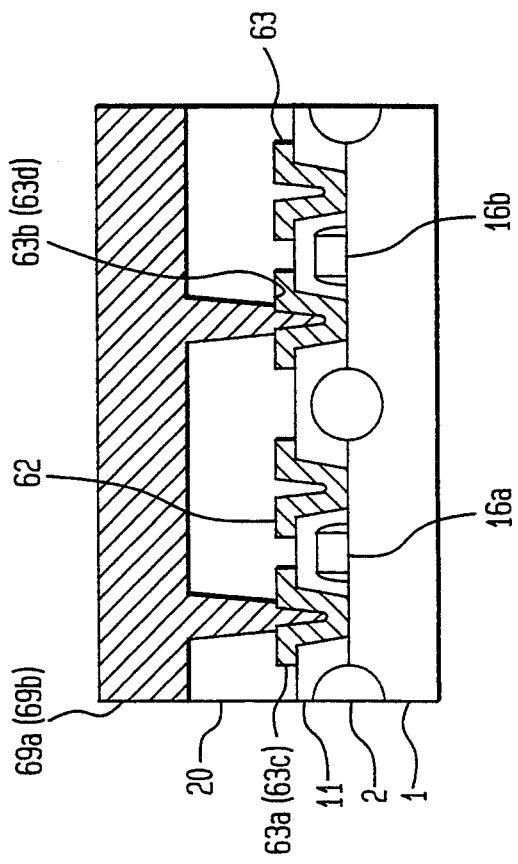

Referring to FIGS. 14A and 14B, a CMOS device having the polycide interconnection of FIG. 5D is described. FIGS. 14A and 14B show an example of the invention in which a dual-polycide interconnection is utilized, and a prior art example in which a dual-polycide interconnection is not utilized, respectively. FIGS. 15A and 15B are sectional views of FIGS. 14A and 14B, respectively.

The CMOS semiconductor device of this example is a two-stage CMOS inverter having two n-channel MOS transistors and two p-channel MOS transistors. Both the two transistors shown in an upper portion of FIG. 14A are p-channel MOS transistors, and both the transistors shown in a lower portion of FIG. 14B are n-channel MOS transistors. As is shown in FIG. 15A, a source of each of the p-channel MOS transistors is connected to a power supply line (not shown) via a metal interconnection 69a. A source of each of the n-channel MOS transistors is connected to a ground line (not shown) via a metal interconnection 69b. As is shown in FIGS. 14A and 15A, a polycide interconnection 63a or 63b is interposed between the source of the p-channel MOS transistor and the metal interconnection 69a. Similarly, a polycide interconnection 63c or 63d is interposed between the source of the n-channel MOS transistor and the metal interconnection 69b.

The drain of the p-channel MOS transistor which is closer to the input terminal (IN) is mutually connected to the drain of the corresponding n-channel MOS transistor (the n-channel MOS transistor which is closer to the input terminal) via a dual-polycide interconnection 62. The drain of the p-channel MOS transistor which is closer to the output terminal (OUT) is mutually connected to the drain of the corresponding n-channel MOS transistor (the n-channel transistor which is closer to the output terminal) via a dual-polycide interconnection 63. The dual-polycide interconnection 63 also serves as the output terminal (OUT). The gates of the p-channel and the n-channel transistors which are closer to the input terminal (IN) are connected to the input terminal (IN) formed of a polycide interconnection via a gate electrode 16a. The gates of the p-channel and the n-channel transistors which are closer to the output terminal are connected to the output terminal (OUT) formed of the polycide interconnection 63 via a gate electrode 16b.

In the process for fabricating the CMOS semiconductor device of this example, the impurity segregation in the polycide interconnection is prevented from occurring, and the lateral diffusion can be suppressed. As a result, the decrease in contact resistance is avoided.

As is shown in FIGS. 14B and 15B, in the prior art example, the drain of the p-channel MOS transistor and the drain of the n-channel MOS transistor are mutually connected by metal interconnections 72 and 73 not by dual-polycide interconnections. The input terminal is constituted by a metal interconnection 71. The sources of the MOS transistors are connected to a power supply line and a ground line, respectively, via a metal interconnection 70.

As is shown in FIGS. 14A and 15A, the CMOS semiconductor device of this example is reduced in its occupied area as compared with the prior art example. Therefore, a small-sized CMOS semiconductor device in which the contact characteristics are not likely to deteriorate can be realized. Moreover, a CMOS semiconductor device which is highly integrated is provided. For the sake of simplicity, this example of the invention is described using a two-stage CMOS inverter, and alternatively, the invention can be applied to another type of CMOS semiconductor device.

According to the semiconductor device of the invention, the boron segregation in the polycide interconnection is prevented, so that the boron concentration in the polycide interconnection does not decrease after the annealing step. As a result, a threshold voltage of an MOS transistor which has such a polycide interconnection as a gate electrode is difficult to vary. Moreover, a stable contact characteristic is attained that the contact resistance between the polycide interconnection and a p-type impurity diffused region does not increase due to the annealing step.

According to the invention, the lateral diffusion of impurities is prevented in a dual-polycide interconnection, so that a CMOS semiconductor device in which a degradation in contact characteristic is suppressed is provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:
   a semiconductor substrate;
   a p-type impurity diffused region formed in the semiconductor substrate;
   a polycide interconnection electrically connected to the p-type impurity diffused region,
   wherein the polycide interconnection comprises a first p-type impurity doped polysilicon film, a refractory metal silicide film formed on the first p-type impurity doped polysilicon film, and a second p-type impurity doped polysilicon film formed on the refractory metal silicide film, the refractory metal silicide film being deposited without heat treatment for silicidation, the refractory metal silicide film being doped with p-type impurities; and
   an insulating layer deposited on the second p-type impurity doped polysilicon film,
   thereby eliminating an interface between the refractory metal silicide film and the insulating layer, and preventing formation of a segregation site for the p-type impurities during a heat treatment performed after depositing the insulating layer on the second p-type impurity doped polysilicon film.

2. A semiconductor device according to claim 1 further comprising a p-channel MOS transistor formed on the semiconductor substrate, wherein the p-type impurity diffused region is either one of a source and a drain of the p-channel MOS transistor.

3. A semiconductor device according to claim 1 or 2, wherein the first p-type impurity doped polysilicon film in the polycide interconnection has a portion in which n-type impurities are diffused, and the portion does not exist over the p-type impurity diffused region in the semiconductor substrate.

4. A semiconductor device comprising:
   a polycide interconnection to be connected to both an n-type impurity diffused region and a p-type impurity diffused region in a semiconductor substrate, the polycide interconnection comprising a first polysilicon film, a refractory metal silicide film formed on the first polysilicon film, and a second polysilicon film formed on the refractory metal silicide film, the refractory metal silicide film being deposited without heat treatment for silicidation, the refractory metal silicide film being doped with p-type impurities; and
   an insulating layer deposited on the second polysilicon film,
   wherein the first polysilicon film has both a p-type impurity diffused portion which is connected to the p-type impurity diffused region in the semiconductor substrate and an n-type impurity diffused portion which is connected to the n-type impurity diffused region in the semiconductor substrate, and the p-type impurities are substantially uniformly diffused in a lateral direction in the entire second polysilicon film,
   thereby eliminating an interface between the refractory metal silicide film and the insulating layer, and preventing formation of a segregation site for the p-type impurities during a heat treatment performed after depositing the insulating layer on the second polysilicon film.

5. A CMOS semiconductor device comprising:
   a semiconductor substrate; and
   an n-channel MOS transistor and a p-channel MOS transistor formed at the semiconductor substrate,
   wherein the n-channel MOS transistor has an n-type source and an n-type drain formed from an n-type impurity diffused region in the semiconductor substrate, and
   the p-channel MOS transistor has a p-type source and a p-type drain formed from a p-type impurity diffused region in the semiconductor substrate,
   the CMOS semiconductor device further comprises a first polysilicon film, a refractory metal silicide film formed on the first polysilicon film, a second polysilicon film formed on the refractory metal silicide film and an insulating layer deposited on the second polysilicon film, wherein the refractory metal silicide film is deposited without heat treatment for silicidation, and the refractory metal silicide film is doped with p-type impurities, the first polysilicon film having both an n-type impurity diffused portion which is connected to the n-type source or the n-type drain and a p-type impurity diffused portion which is connected to the p-type source or the p-type drain, and the p-type impurities being substantially uniformly diffused in a lateral direction in the entire second polysilicon film, thereby eliminating an interface between the refractory metal silicide film and the insulating layer, and preventing formation of a segregation site for the p-type impurities during a heat treatment performed after depositing the insulating layer on the second polysilicon film.

6. A semiconductor device comprising:

a semiconductor substrate;

a source and a drain formed in the semiconductor substrate;

a gate insulating film formed on the semiconductor substrate;

a gate electrode formed on the gate insulating film, wherein the gate electrode has a first p-type impurity doped polysilicon film, a refractory metal silicide film formed on the first p-type impurity doped polysilicon film, and a second p-type impurity doped polysilicon film formed on the refractory metal silicide film, the refractory metal silicide film being deposited without heat treatment for silicidation, the refractory metal silicide film being doped with p-type impurities; and an insulating layer deposited on the second p-type impurity doped polysilicon film, thereby eliminating an interface between the refractory metal silicide film and the insulating layer, and preventing formation of a segregation site for the p-type impurities during a heat treatment performed after depositing the insulating layer on the second p-type impurity doped polysilicon film.

7. A method of fabricating a semiconductor device, comprising the steps of:

forming a p-type impurity diffused region in a semiconductor substrate;

forming a polycide interconnection which is connected to the p-type impurity diffused region; and depositing an insulating layer on the polycide interconnection, wherein the step of forming the polycide interconnection comprising the steps of:

forming a first polysilicon film which is connected to the p-type impurity diffused region;

depositing a refractory metal silicide film on the first polysilicon film without heat treatment;

forming a second polysilicon film on the refractory metal silicide film; and doping p-type impurities into at least one of the first polysilicon film, the refractory metal silicide film and the second polysilicon film, the p-type impurities diffusing entirely into the polycide interconnection thereafter, thereby eliminating an interface between the refractory metal silicide film and the insulating layer, and preventing formation of a segregation site for the p-type impurities during heat treatment conducted after depositing the insulating layer on the second p-type impurity doped polysilicon film.

8. A method of fabricating a semiconductor device according to claim 7, wherein the step of doping p-type impurities uses ion implantation process.

* * * * *

UNITED STATES PATENT AND TRADEMARK OFFICE
CERTIFICATE OF CORRECTION

PATENT NO. : 5,341,014
DATED : August 23, 1994
INVENTOR(S) : Toyokazu Fujii et al.

It is certified that error appears in the above-identified patent and that said Letters Patent is hereby corrected as shown below:

Title Page, right column, line 9, change "1986" to --1985--.

Cover Sheet, right column, Primary Examiner's name, change "Wojkciechowicz" to --Wojciechowicz--.

Column 7, line 19, after "type" insert --second--.

The drawing sheet page 4 of 11, should be deleted to be replaced with the drawing sheet as shown on the attached page.

Signed and Sealed this

Eleventh Day of April, 1995

*Attest:*

BRUCE LEHMAN

*Attesting Officer*      *Commissioner of Patents and Trademarks*

UNITED STATES PATENT AND TRADEMARK OFFICE
CERTIFICATE OF CORRECTION

PATENT NO. : 5,341,014
DATED : August 23, 1994
INVENTOR(S) : Toyokazu Fujii et al.

Page 2 of 2

It is certified that error appears in the above-identified patent and that said Letters Patent is hereby corrected as shown below:

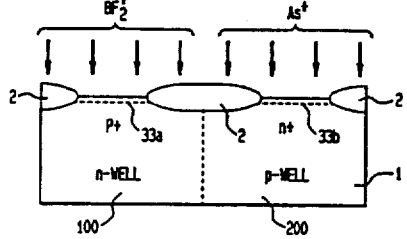

FIG. 5A

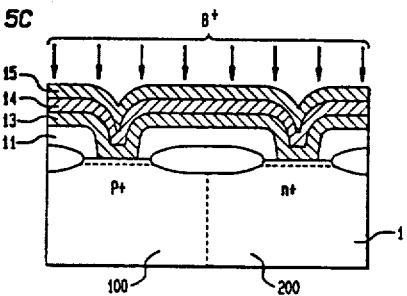

FIG. 5C

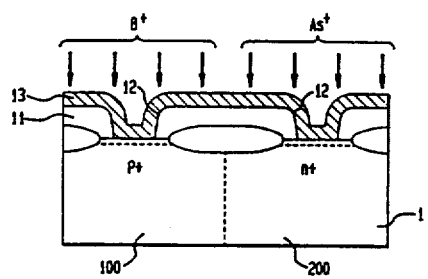

FIG. 5B

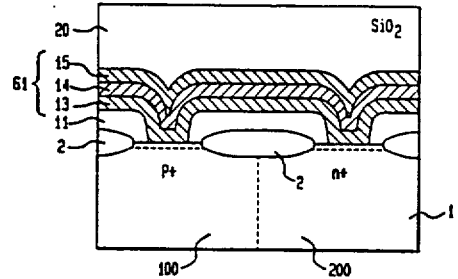

FIG. 5D